United States Patent
Yun et al.

(10) Patent No.: US 11,552,273 B2
(45) Date of Patent: Jan. 10, 2023

(54) DISPLAY DEVICE WITH REFRACTIVE LAYERS

(71) Applicant: Samsung Display Co., Ltd., Yongin-si (KR)

(72) Inventors: Haeyoung Yun, Suwon-si (KR); Jiryun Park, Cheonan-si (KR); Beohmrock Choi, Seoul (KR); Kangwook Heo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 171 days.

(21) Appl. No.: 16/859,868

(22) Filed: Apr. 27, 2020

(65) Prior Publication Data

US 2021/0050557 A1 Feb. 18, 2021

(30) Foreign Application Priority Data

Aug. 13, 2019 (KR) ........................ 10-2019-0098562

(51) Int. Cl.
  *H01L 51/52* (2006.01)
  *H01L 27/32* (2006.01)

(52) U.S. Cl.
  CPC ........ *H01L 51/5275* (2013.01); *H01L 27/323* (2013.01); *H01L 27/3246* (2013.01); *H01L 51/5253* (2013.01); *H01L 51/5281* (2013.01); *H01L 2251/303* (2013.01)

(58) Field of Classification Search
  CPC combination set(s) only.
  See application file for complete search history.

(56) References Cited

U.S. PATENT DOCUMENTS

| 6,072,450 | A  | 6/2000 | Yamada et al. |
| 7,535,646 | B2 | 5/2009 | Chari et al. |
| 9,142,802 | B2 | 9/2015 | Miyamoto et al. |
| 10,050,236 | B2 | 8/2018 | Chen et al. |

(Continued)

FOREIGN PATENT DOCUMENTS

| EP | 3 654 381 A1 | 5/2020 |
| EP | 3 734 682 A1 | 11/2020 |

(Continued)

OTHER PUBLICATIONS

Extended European Search Report dated Dec. 8, 2020 for European Patent Application No. 20182510.6.

*Primary Examiner* — Nduka E Ojeh
(74) *Attorney, Agent, or Firm* — Lewis Roca Rothgerber Christie LLP

(57) ABSTRACT

A display device may include a pixel electrode, a pixel defining layer on the pixel electrode and having a pixel opening that exposes at least a portion of the pixel electrode, an emission layer on the pixel electrode in the pixel opening, an opposite electrode on the emission layer, a first refractive layer on the opposite electrode and having a refractive opening, the first refractive layer having a first refractive index, and a second refractive layer on the first refractive layer and having a second refractive index greater than the first refractive index. A maximum inclination angle of a sidewall of the first refractive layer exposed by the refractive opening with respect to a lower surface of the first refractive layer may be between about 65 degrees and about 90 degrees.

20 Claims, 8 Drawing Sheets

(56) References Cited

U.S. PATENT DOCUMENTS

| | | | |
|---|---|---|---|
| 2015/0333108 A1 | 11/2015 | Miyamoto et al. | |
| 2017/0279084 A1* | 9/2017 | Sakamoto | H01L 27/3258 |
| 2018/0138458 A1* | 5/2018 | Tokuda | H01L 51/524 |
| 2018/0350883 A1 | 12/2018 | Lee et al. | |
| 2019/0013495 A1* | 1/2019 | Kim | H01L 51/5275 |
| 2019/0115404 A1* | 4/2019 | Moon | H01L 51/5012 |
| 2019/0165061 A1* | 5/2019 | Jung | H01L 27/3246 |
| 2019/0221779 A1* | 7/2019 | Jang | H01L 27/323 |

FOREIGN PATENT DOCUMENTS

| | | |
|---|---|---|
| KR | 10-0837486 B1 | 6/2008 |
| KR | 10-2016-0017397 | 2/2016 |
| KR | 10-2016-0027608 A | 3/2016 |
| KR | 10-2018-0005323 A | 1/2018 |

\* cited by examiner

DISPLAY DEVICE WITH REFRACTIVE LAYERS

CROSS-REFERENCE TO RELATED APPLICATION(S)

This application claims priority to and the benefit of Korean Patent Application No. 10-2019-0098562 filed on Aug. 13, 2019 in the Korean Intellectual Property Office (KIPO), the entire disclosure of which is incorporated by reference herein.

BACKGROUND

1. Field

Embodiments of the present disclosure relate to a display device. More particularly, embodiments relate to a display device having improved light efficiency.

2. Description of the Related Art

An organic light emitting display device is a self-emission type display device which displays an image using an organic light emitting diode that emits light. The organic light emitting diode may include two opposing electrodes and an emission layer formed therebetween. Organic light emitting display devices exhibit characteristics such as low power consumption, high brightness, fast response speed, and the like, and thus have drawn attention as a next-generation display device.

In organic light emitting display devices, it is generally desirable for light generated from the emission layer to be directed toward a user. However, because light generated from the emission layer of the organic light emitting display device generally travels in a plurality of directions including a front direction and a side direction, brightness in the front direction in which the user is located may be low because the light emitted in the side direction may not be visible to the user.

SUMMARY

Embodiments of the present disclosure relate to a display device having improved light efficiency.

A display device according to embodiments may include a pixel electrode, a pixel defining layer on the pixel electrode and having a pixel opening that exposes at least a portion of the pixel electrode, an emission layer on the pixel electrode in the pixel opening, an opposite electrode on the emission layer, a first refractive layer on the opposite electrode and having a refractive opening, the first refractive layer having a first refractive index, and a second refractive layer on the first refractive layer, the second refractive layer having a second refractive index greater than the first refractive index. A maximum inclination angle of a sidewall of the first refractive layer exposed by the refractive opening with respect to a lower surface of the first refractive layer may be between 65 degrees and 90 degrees.

In an embodiment, an undercut may not be formed at the sidewall of the first refractive layer.

In an embodiment, the refractive opening may overlap the pixel opening.

In an embodiment, light emitted from the emission layer may be totally reflected by the sidewall of the first refractive layer.

In an embodiment, a difference between the second refractive index and the first refractive index is greater than or equal to 0.15.

In an embodiment, the first refractive index may be about 1.5 and the second refractive index may be about 1.65.

In an embodiment, an upper surface of the second refractive layer may be planarized.

In an embodiment, the refractive opening may have the same shape as a shape of the pixel opening.

In an embodiment, the display device may further include a thin film encapsulation layer between the opposite electrode and the first refractive layer and having a planarized upper surface.

In an embodiment, the display device may further include an input sensing layer between the thin film encapsulation layer and the first refractive layer. The first refractive layer may cover the input sensing layer.

In an embodiment, the display device may further include a polarizing layer on the second refractive layer.

A display device according to embodiments may include a pixel electrode, a pixel defining layer on the pixel electrode and having a pixel opening that exposes at least a portion of the pixel electrode, an emission layer on the pixel electrode in the pixel opening, an opposite electrode on the emission layer, a first refractive layer on the opposite electrode and having a refractive opening, the first refractive layer having a first refractive index, and a second refractive layer on the first refractive layer and having a second refractive index greater than the first refractive index. A difference between the second refractive index and the first refractive index may be greater than or equal to 0.15.

In an embodiment, the first refractive index may be about 1.5 and the second refractive index may be about 1.65.

In an embodiment, the refractive opening may overlap the pixel opening.

In an embodiment, light emitted from the emission layer may be totally reflected by a sidewall of the first refractive layer exposed by the refractive opening.

In an embodiment, the first refractive layer may include a photoresist.

In an embodiment, the first refractive layer may include acrylic resin.

In an embodiment, the second refractive layer may include siloxane and at least one of zirconium oxide, aluminum oxide, and titanium oxide.

A display device according to embodiments may include a light emitting element, a pixel defining layer surrounding the light emitting element, a first refractive layer on the light emitting element and the pixel defining layer, the first refractive layer overlapping the pixel defining layer and having a first refractive index, and a second refractive layer on the first refractive layer, the second refractive layer overlapping the light emitting element and the pixel defining layer and having a second refractive index greater than the first refractive index. A maximum inclination angle of a sidewall of the first refractive layer with respect to a lower surface of the first refractive layer may be between about 65 degrees and about 90 degrees.

In an embodiment, light emitted from the light emitting element may be totally reflected by the sidewall of the first refractive layer.

In an embodiment, a difference between the second refractive index and the first refractive index may be greater than or equal to about 0.15.

In the display device according to some embodiments, the maximum inclination angle of the sidewall of the first refractive layer may be about 65 degrees or more and about 90 degrees or less, or the difference between the second refractive index of the second refractive layer and the first refractive index of the first refractive layer may be about 0.15 or more. Accordingly, the front light efficiency of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
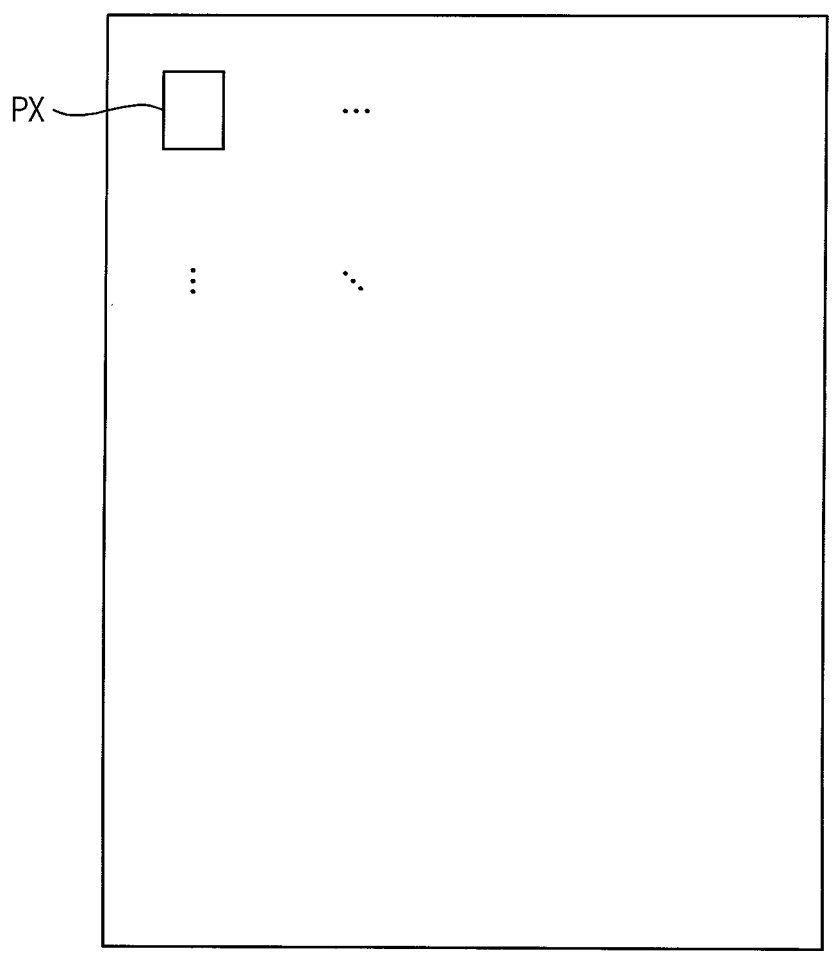
FIG. 1 is a plan view of a display device according to an embodiment.

Hereinafter, display devices in accordance with embodiments will be explained in detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures (e.g., in the frame of reference of the figures). It will be understood that the spatially relative terms are intended to encompass different orientations of the device in use or in operation, in addition to the orientation (or frame of reference) depicted in the figures. For example, if the device in the figures is turned over, elements described as "below" or "beneath" or "under" other elements or features would then be oriented "above" the other elements or features according to an external frame of reference, but would still be "below" or "beneath" or "under" in a spatially relative perspective based on the frame of reference shown in the figures. Thus, the example terms "below" and "under" can encompass both an orientation of above and below, based on an external frame of reference. The device may be otherwise oriented (e.g., rotated 90 degrees or at other orientations) and the spatially relative descriptors used herein should be interpreted accordingly.

As used herein, when two elements or components that are both on the same substrate "overlap," the two elements or components are above and below one another and arranged such that a line perpendicular to the substrate passes through both elements.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment.

Referring to FIG. 1, a display device may include a plurality of pixels PX. The pixels PX may be arranged in a matrix having a row direction and a column direction (e.g., the pixels PX may be arranged in rows and columns). A display area of the display device may be configured to display a color image, and the display area may be divided into pixels PX in a plan view, where one pixel PX may be a minimum unit of the display device which may express a color independently from the other pixels. The display device may display an image formed by light emitted from the plurality of pixels PX.

Figure 2:
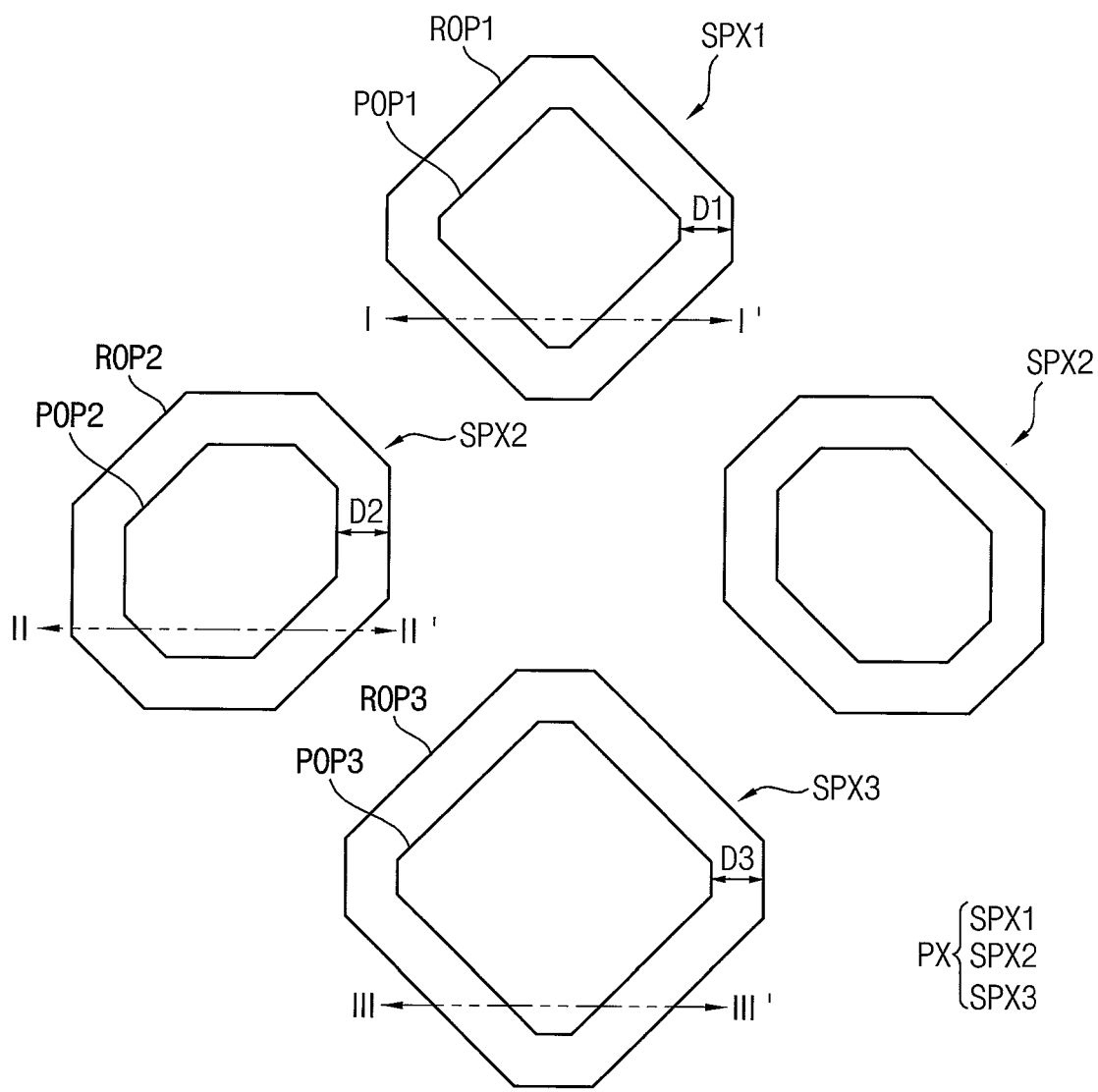
FIG. 2 is a plan view illustrating a pixel included in the display device in FIG. 1.

FIG. 2 is a plan view illustrating the pixel PX included in the display device in FIG. 1.

Referring to FIG. 2, each pixel PX may include a plurality of sub-pixels. The sub-pixels may include a first sub-pixel SPX1, a second sub-pixel SPX2, and a third sub-pixel SPX3. In an embodiment, each pixel PX may include one first sub-pixel SPX1, two second sub-pixels SPX2, and one third sub-pixel SPX3. In such an embodiment, the first, second, and third sub-pixels SPX1, SPX2, and SPX3 may be arranged in a pentile matrix form. However, the number of the sub-pixels included in each pixel PX is not limited thereto, and in another embodiment, each pixel PX may include one first sub-pixel SPX1, one second sub-pixel SPX2, and one third sub-pixel SPX3. In such an embodiment, the first, second, and third sub-pixels SPX1, SPX2, and SPX3 may be arranged in a stripe form.

The first sub-pixel SPX1, the second sub-pixel SPX2, and the third sub-pixel SPX3 may emit light having different colors. In an embodiment, the first sub-pixel SPX1, the second sub-pixel SPX2, and the third sub-pixel SPX3 may be a red sub-pixel emitting red light, a green sub-pixel emitting green light, and a blue sub-pixel emitting blue light, respectively. Each pixel PX may independently control a brightness of light emitted from each of the first sub-pixel SPX1, the second sub-pixel SPX2, and the third sub-pixel SPX3, thereby controlling the pixel PX as a whole to emit light having various colors (e.g., based on the combination of the red, green, and blue lights emitted by the sub-pixels). Accordingly, the display device may display a color image formed of light having various colors emitted from the plurality of pixels PX.

Figure 3:
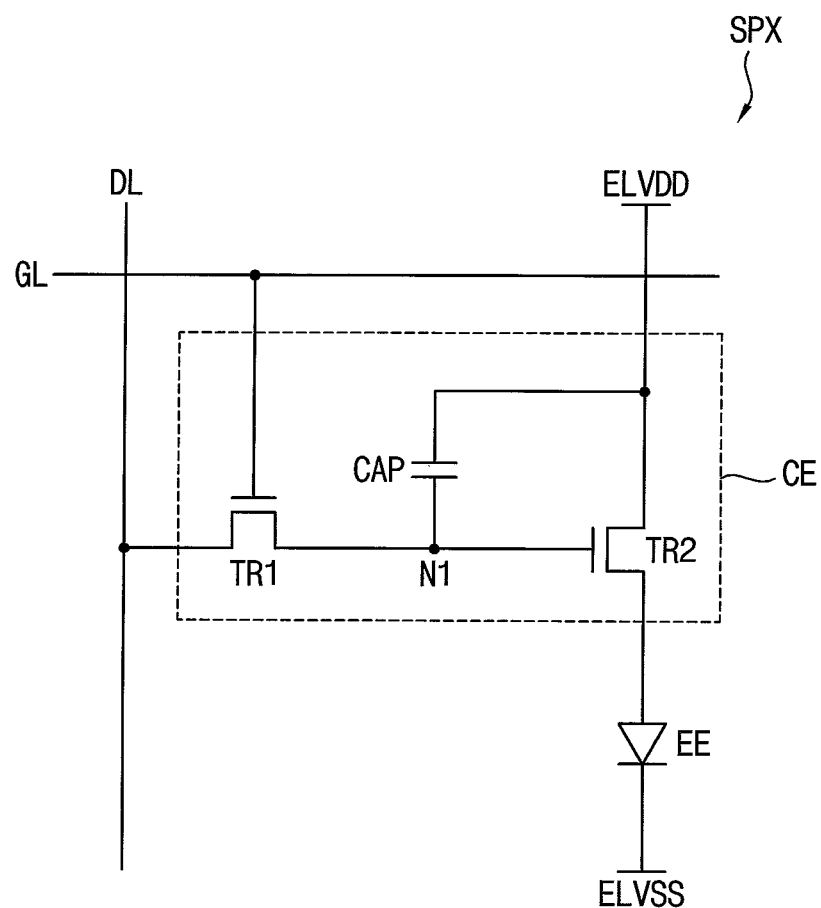
FIG. 3 is a circuit diagram illustrating a pixel circuit of a sub-pixel included in the pixel in FIG. 2.

FIG. 3 is a circuit diagram illustrating a pixel circuit of the sub-pixel SPX included in the pixel PX in FIG. 2. The sub-pixel SPX illustrated in FIG. 3 may be any one of the first sub-pixel SPX1, the second sub-pixel SPX2, and the third sub-pixel SPX3 in FIG. 2.

Referring to FIG. 3, the sub-pixel SPX may be electrically connected to a gate line GL, a data line DL, a first power source ELVDD, and a second power source ELVSS. The gate line GL may extend along a row direction of the display area, and the data line DL may extend along a column direction of the display area. In an embodiment, a voltage level of the first power source ELVDD may be greater than a voltage level of the second power source ELVSS. The sub-pixel SPX may be disposed in a portion at which the gate line GL and the data line DL cross, and may receive a gate signal and a data signal from the gate line GL and the data line DL, respectively. The sub-pixel SPX may emit light based on the gate signal and the data signal (e.g., based on the data signal transmitted to the sub-pixel SPX via the data line DL when the gate signal is supplied to the sub-pixel SPX via the gate line GL).

The sub-pixel SPX may include a circuit element CE and a light emitting element EE. The circuit element CE may generate a driving current based on the gate signal and the data signal, and may provide the driving current to the light emitting element EE. In an embodiment, the circuit element CE may include a first transistor TR1, a second transistor TR2, and a capacitor CAP. However, the present disclosure is not limited thereto, and in another embodiment, the circuit element CE may include three or more transistors and/or two or more capacitors.

The first transistor TR1 may include a gate electrode connected to the gate line GL, a source electrode connected to the data line DL, and a drain electrode connected to a first node N1. The second transistor TR2 may include a gate electrode connected to the first node N1, a source electrode connected to the first power source ELVDD, and a drain electrode connected to the light emitting element EE. The capacitor CAP may include a first capacitor electrode connected to the first node N1 and a second capacitor electrode connected to the first power source ELVDD.

The light emitting element EE may emit light based on the driving current provided from the circuit element CE. The light emitting element EE may include an anode connected to the second transistor TR2 and a cathode connected to the second power source ELVSS.

When the first transistor TR1 is turned on in response to the gate signal transmitted from the gate line GL, the first transistor TR1 may transmit the data signal transmitted from the data line DL to the first node N1. The second transistor TR2 may generate the driving current based on a voltage between the first power source ELVDD and the first node N1 which is stored in the capacitor CAP, and may provide the driving current to the light emitting element EE. The light emitting element EE may emit light based on the driving current.

Figure 4:
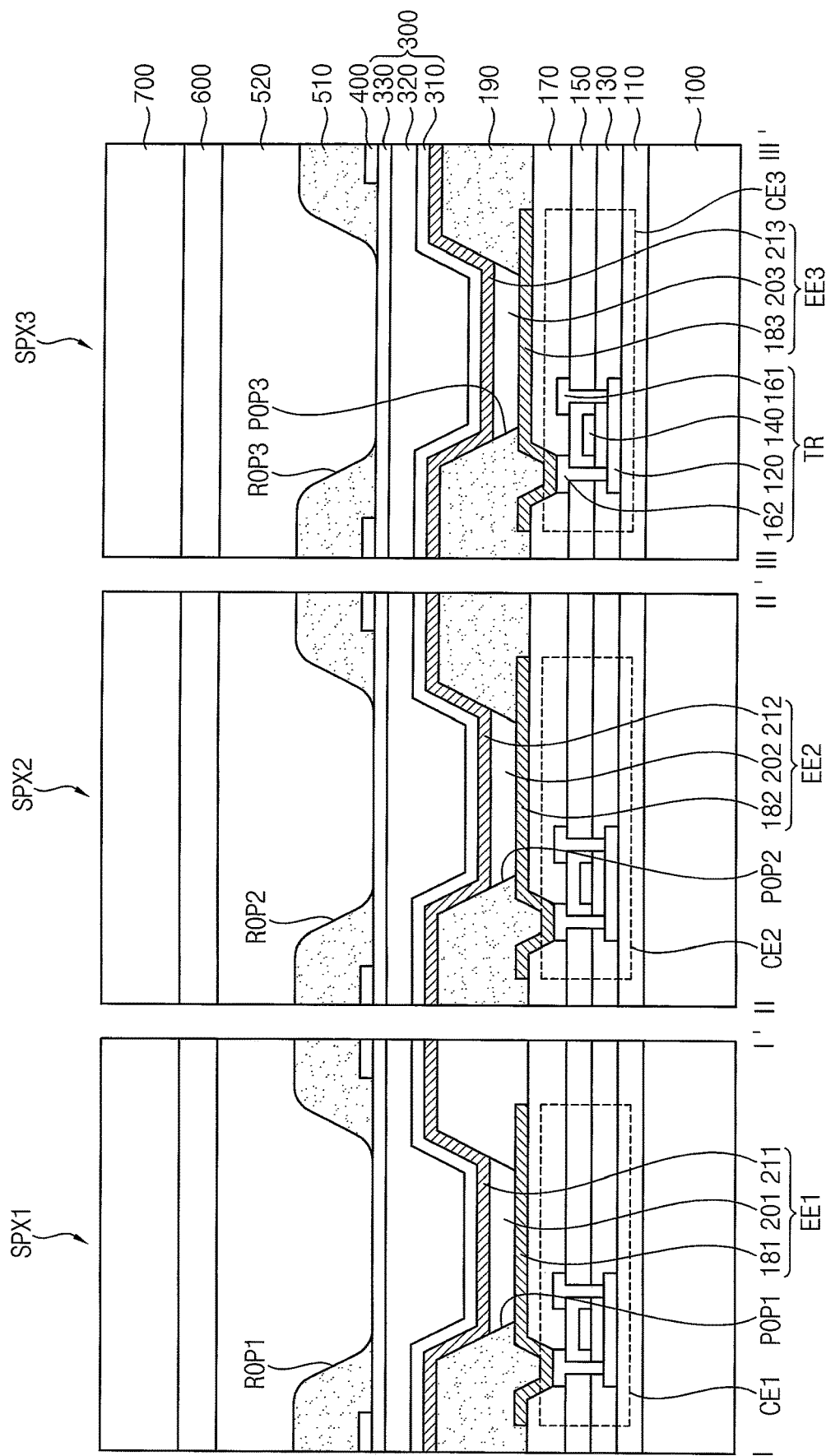
FIG. 4 is a cross-sectional view of sub-pixels taken along lines I-I', and III-III' in FIG. 2.

FIG. 4 is a cross-sectional view of sub-pixels taken along lines I-I', and III-III' in FIG. 2.

Referring to FIGS. 2 and 4, the pixel PX of the display device may include a substrate 100, first, second, and third circuit elements CE1, CE2, and CE3, first, second, and third light emitting elements EE1, EE2, and EE3, a thin film encapsulation layer 300, an input sensing layer 400, a first refractive layer 510, a second refractive layer 520, a polarizing layer 600, and a window 700. The first sub-pixel SPX1 may include the first circuit element CE1 and the first light emitting element EE1 electrically connected thereto, the second sub-pixel SPX2 may include the second circuit element CE2 and the second light emitting element EE2 electrically connected thereto, and the third sub-pixel SPX3 may include the third circuit element CE3 and the third light emitting element EE3 electrically connected thereto. Each of the first circuit element CE1, the second circuit element CE2, and the third circuit element CE3 may include a transistor TR. For example, the transistor TR may be the second transistor TR2 illustrated in FIG. 3. Each of the first circuit element CE1, the second circuit element CE2, and the third circuit element CE3 may further include the first transistor TR1 and the capacitor CAP.

The substrate 100 may be an insulating substrate and may include glass, quartz, plastic, or the like. In an embodiment, the substrate 100 may be a flexible substrate. In such an embodiment, the substrate 100 may include, for example, a polymer resin such as polycarbonate (PC), polymethyl methacrylate (PMMA), polyarylate (PAR), polyethersulfone (PES), polyethylene terephthalate (PET), polyethylene naphthalate (PEN), or the like.

A buffer layer 110 may be disposed on the substrate 100. The buffer layer 110 may block or prevent impurities such as oxygen, moisture, etc., from permeating through the substrate 100. Further, the buffer layer 110 may provide a planarized surface (or planar surface) on the substrate 100. The buffer layer 110 may be an inorganic insulation layer including silicon nitride, silicon oxide, silicon oxynitride, or the like. Alternatively, in some embodiments, the buffer layer 110 may be omitted.

A semiconductor layer 120 may be disposed on the buffer layer 110. The semiconductor layer 120 may be formed of amorphous silicon, polysilicon, an oxide semiconductor, or the like. For example, when the semiconductor layer 120 is formed of polysilicon, the semiconductor layer 120 may include a channel region in which impurities are not doped, and a source region and a drain region in which impurities are doped at opposite sides of the channel region. For example, doping impurities may be P-type impurities such as boron (B) and B2H6 may be generally used. The impurities may be changed according to types of the transistor. A PMOS transistor using the P-type impurities is used as the transistor TR in some embodiments. However, the transistor TR is not limited thereto, and an NMOS transistor or a CMOS transistor may be used as the transistor TR.

A first insulation layer 130 may be disposed on the semiconductor layer 120. The first insulation layer 130 may cover the semiconductor layer 120, and may be disposed on the buffer layer 110. The first insulation layer 130 may be an inorganic insulation layer including silicon nitride, silicon oxide, silicon oxynitride, or the like.

A gate electrode 140 may be disposed on the first insulation layer 130. The gate electrode 140 may overlap the channel region of the semiconductor layer 120. The gate electrode 140 may be formed of molybdenum (Mo), chromium (Cr), tungsten (W), or the like.

A second insulation layer 150 may be disposed on the gate electrode 140. The second insulation layer 150 may cover the gate electrode 140, and may be disposed on the first insulation layer 130. The second insulation layer 150 may be an inorganic insulation layer including silicon nitride, silicon oxide, silicon oxynitride, or the like.

A source electrode 161 and a drain electrode 162 may be disposed on the second insulation layer 150. The source electrode 161 and the drain electrode 162 may be in contact with the source region and the drain region of the semiconductor layer 120, respectively, through contact holes passing through the first insulation layer 130 and the second insulation layer 150. The source electrode 161 and the drain electrode 162 may be formed of aluminum (Al), titanium (Ti), chromium (Cr), tungsten (W), or the like. The semiconductor layer 120, the gate electrode 140, the source electrode 161, and the drain electrode 162 may form the transistor TR.

A planarization layer 170 may be disposed on the source electrode 161 and the drain electrode 162. The planarization layer 170 may cover the source electrode 161 and the drain electrode 162, and may be disposed on the second insulation layer 150. The planarization layer 170 may provide a planarized surface on the source electrode 161 and the drain electrode 162. The planarization layer 170 may be an organic insulation layer including acrylic resin, epoxy-based resin, polyimide-based resin, polyester-based resin, or the like, and/or an inorganic insulation layer including silicon nitride, silicon oxide, silicon oxynitride, or the like.

The first light emitting element EE1, the second light emitting element EE2, and the third light emitting element EE3 may be disposed on the planarization layer 170. The first light emitting element EE1 may include a first pixel electrode 181, a first emission layer 201 and a first opposite electrode 211, the second light emitting element EE2 may include a second pixel electrode 182, a second emission layer 202 and a second opposite electrode 212, and the third light emitting element EE3 may include a third pixel electrode 183, a third emission layer 203 and a third opposite electrode 213.

The first pixel electrode 181, the second pixel electrode 182, and the third pixel electrode 183 may be disposed on the planarization layer 170. The first pixel electrode 181, the second pixel electrode 182, and the third pixel electrode 183 may be electrically connected to the first circuit element CE1, the second circuit element CE2, and the third circuit element CE3, respectively, through contact holes formed in the planarization layer 170. The first, second, and third pixel electrodes 181, 182, and 183 may be respectively individually formed in the first, second, and third sub-pixels SPX1, SPX2, and SPX3. In other words, the first, second, and third pixel electrodes 181, 182, and 183 may be separated from or spaced apart from each other.

A pixel defining layer 190 may be disposed on the first pixel electrode 181, the second pixel electrode 182, and the third pixel electrode 183. The pixel defining layer 190 may cover the first pixel electrode 181, the second pixel electrode 182, and the third pixel electrode 183, and may be formed on the planarization layer 170. The pixel defining layer 190 may include an organic material such as polyimide (PI), hexamethyldisiloxane (HMDSO), or the like.

The pixel defining layer 190 may have a first pixel opening POP1, a second pixel opening POP2, and a third pixel opening POP3 which respectively expose at least a portion of the first pixel electrode 181, at least a portion of the second pixel electrode 182, and at least a portion of the third pixel electrode 183. For example, the first pixel opening POP1, the second pixel opening POP2, and the third pixel opening POP3 may respectively expose a center portion (or central portion) of the first electrode 181, a center portion (or central portion) of the second electrode 182, and a center portion (or central portion) of the third electrode 183. The pixel defining layer 190 may cover a peripheral portion of the first electrode 181, a peripheral portion of the second electrode 182, and a peripheral portion of the third electrode 183. The pixel defining layer 190 may define the first, second, and third sub-pixels SPX1, SPX2, and SPX3 by having the first pixel opening POP1, the second pixel opening POP2, and the third pixel opening POP3.

The size of the first pixel opening POP1, the size of the second pixel opening POP2, and the size of the third pixel opening POP3 may be different from each other. In an embodiment, the size of the second pixel opening POP2 may be less than (e.g., smaller than) the size of the first pixel opening POP1, and the size of the third pixel opening POP3 may be greater than (e.g., larger than) the size of the first pixel opening POP1.

The first emission layer 201 may be disposed on the first pixel electrode 181 in the first pixel opening POP1, the second emission layer 202 may be disposed on the second pixel electrode 182 in the second pixel opening POP2, and the third emission layer 203 may be disposed on the third pixel electrode 183 in the third pixel opening POP3. Each of the first emission layer 201, the second emission layer 202, and the third emission layer 203 may include at least one of organic light emitting material and quantum dot (or quantum dots).

In an embodiment, the organic light emitting material may include a low molecular weight polymer or a high molecular weight polymer. For example, the low molecular weight polymer may include copper phthalocyanine, N,N'-diphenylbenzidine, tris-(8-hydroxyquinoline)aluminum, etc., and the high molecular weight polymer may include poly(3,4-ethylenedioxythiophene), polyaniline, poly-phenylenevinylene, polyfluorene, etc.

In an embodiment, the quantum dot material may include a core that includes a group II-VI compound, a group III-V compound, a group IV-VI compound, a group IV element, a group IV compound, and/or a combination thereof. In an embodiment, the quantum dot may have a core-shell structure that includes a core and a shell surrounding the core. The shell may serve as a protective layer for mitigating or preventing chemical degeneration (or degradation) of the core to maintain a semiconductor property of the core and a charging layer for imparting electrophoretic properties to the quantum dot.

The first emission layer 201, the second emission layer 202, and the third emission layer 203 may emit light having different colors from each other. In an embodiment, the first emission layer 201, the second emission layer 202, and the third emission layer 203 respectively emit red light, green light, and blue light.

The first opposite electrode 211, the second opposite electrode 212, and the third opposite electrode 213 may be respectively disposed on the first emission layer 201, the second emission layer 202, and the third emission layer 203. The first, second, and third opposite electrodes 211, 212, and 213 may be commonly formed in the first, second, and third sub-pixels SPX1, SPX2, and SPX3. In other words, the first, second, and third opposite electrodes 211, 212, and 213 may be connected to each other.

Light generated from the first emission layer 201 may be emitted in a direction from the first pixel electrode 181 toward the first opposite electrode 211, light generated from the second emission layer 202 may be emitted in a direction from the second pixel electrode 182 toward the second opposite electrode 212, and light generated from the third emission layer 203 may be emitted in a direction from the third pixel electrode 183 toward the third opposite electrode 213. In this case, each of the first pixel electrode 181, the second pixel electrode 182, and the third pixel electrode 183 may be formed as a reflective layer, and each of the first opposite electrode 211, the second opposite electrode 212, and the third opposite electrode 213 may be formed as a semi-transmitting (e.g., semi-transparent) layer or a transmitting layer. The reflective layer and the semi-transmitting layer may include a metal such as magnesium (Mg), silver (Ag), gold (Au), calcium (Ca), lithium (Li), chromium (Cr) and aluminum (Al), or an alloy thereof. The reflective layer and the semi-transmitting layer may be divided depending on a thickness, and the semi-transmitting layer may have a thickness less than about 200 nm. The transmitting layer may include indium tin oxide (ITO), indium zinc oxide (IZO), zinc oxide (ZnO), indium oxide ($In_2O_3$), or the like.

The pixel defining layer 190 may cover a peripheral portion of each of the first, second, and third pixel electrodes 181, 182, and 183, and the first, second, and third emission layers 201, 202, and 203 and the first, second, and third opposite electrodes 211, 212, and 213 may be disposed in the first, second, and third pixel openings POP1, POP2, and POP3, respectively. Accordingly, the pixel defining layer 190 may surround the first, second, and third light emitting elements EE1, EE2, and EE3. In an embodiment, the pixel defining layer 190 may have a grid shape in a plan view surrounding the first, second, and third sub-pixels SPX1, SPX2, and SPX3.

The thin film encapsulation layer 300 may be disposed on the first opposite electrode 211, the second opposite electrode 212, and the third opposite electrode 213. The thin film encapsulation layer 300 may cover the first, second, and third light emitting elements EE1, EE2, and EE3 to protect the first, second, and third light emitting elements EE1, EE2, and EE3 from external impurities such as moisture, oxygen, or the like. The thin film encapsulation layer 300 may include at least one inorganic encapsulation layer and at least one organic encapsulation layer. In an embodiment, the thin film encapsulation layer 300 may include a first inorganic encapsulation layer 310, an organic encapsulation layer 320, and a second inorganic encapsulation layer 330.

The first inorganic encapsulation layer 310 may be disposed on the first opposite electrode 211, the second opposite electrode 212, and the third opposite electrode 213. The first inorganic encapsulation layer 310 may include aluminum oxide ($Al_2O_3$), silicon nitride ($SiN_x$), silicon oxide ($SiO_2$), etc. The first inorganic encapsulation layer 310 may be formed along a profile of the first, second, and third opposite electrodes 211, 212, and 213.

The organic encapsulation layer 320 may be disposed on the first inorganic encapsulation layer 310. The organic encapsulation layer 320 may include epoxy, acrylate, urethane acrylate, etc. The organic encapsulation layer 320 may have a planarized upper surface, therefore, the organic encapsulation layer 320 may planarize (e.g., form a planar surface) above the first, second, and third light emitting elements EE1, EE2, and EE3.

The second inorganic encapsulation layer 330 may be disposed on the organic encapsulation layer 320. The second inorganic encapsulation layer 330 may be formed on the first inorganic encapsulation layer 310, and may cover the organic encapsulation layer 320. An edge of the second inorganic encapsulation layer 330 may be in contact with an edge of the first inorganic encapsulation layer 310. Because the second inorganic encapsulation layer 330 is formed on the organic encapsulation layer 320 having the planarized upper surface, the second inorganic encapsulation layer 330 may provide a planarized surface thereon (e.g., an upper surface of the second inorganic encapsulation layer 330 may also be a planar surface). The second inorganic encapsulation layer 330 may include aluminum oxide ($Al_2O_3$), silicon nitride ($SiN_x$), silicon oxide ($SiO_2$), etc. In an embodiment, the second inorganic encapsulation layer 330 may include a material substantially the same as that of the first inorganic encapsulation layer 310.

The input sensing layer 400 may be disposed on the thin film encapsulation layer 300. The input sensing layer 400 may sense an external input such as an external object contacting or approaching the input sensing layer 400. For example, the input sensing layer 400 may sense the external input in a capacitive manner (e.g., by detecting changes in capacitance due to the external object approaching or contacting the input sensing layer).

The input sensing layer 400 may include a low resistance metal such as silver (Ag), aluminum (Al), copper (Cu), chromium (Cr), nickel (Ni), etc., or may include a conductive nano (or nanometer scale) material such as silver nanowire, carbon nanotube, etc. In some embodiments, the input sensing layer 400 overlaps the pixel defining layer 190, and does not overlap the first, second, and third emission layers 201, 202, and 203. Accordingly, light emitted from the first, second, and third emission layers 201, 202, and 203 may be substantially unaffected by the input sensing layer 400.

In an embodiment, the input sensing layer 400 may include a sensing electrode outputting a sensing signal corresponding to an external input to a sensing driver and a driving electrode receiving a driving signal from the sensing driver. For example, a first portion of the input sensing layer 400 may be the sensing electrode, and a second portion of the input sensing layer 400 may be the driving electrode.

The first refractive layer 510 may be disposed on the input sensing layer 400. The first refractive layer 510 may be formed on the thin film encapsulation layer 300, and may cover the input sensing layer 400. The first refractive layer 510 may have a first refractive index that is a relatively low refractive index.

The first refractive layer 510 may include a first refractive opening ROP1, a second refractive opening ROP2, and a third refractive opening ROP3. The first refractive opening ROP1, the second refractive opening ROP2, and the third refractive opening ROP3 may respectively overlap the first pixel opening POP1, the second pixel opening POP2, and the third pixel opening POP3. In this case, the first refractive layer 510 may overlap the pixel defining layer 190. For example, the first refractive layer 510 may have a grid shape in a plan view overlapping the pixel defining layer 190. The first, second, and third refractive openings ROP1, ROP2, and ROP3 may expose an upper surface of the thin film encapsulation layer 300.

In an embodiment, the first refractive opening ROP1 may have a shape substantially the same as that of the first pixel opening POP1 in a plan view, the second refractive opening ROP2 may have a shape substantially the same as that of the second pixel opening POP2 in a plan view, and the third refractive opening ROP3 may have a shape substantially the same as that of the third pixel opening POP3 in a plan view.

In an embodiment, the size of the first refractive opening ROP1, the size of the second refractive opening ROP2, and the size of the third refractive opening ROP3 may be respectively greater (e.g., larger) than the size of the first pixel opening POP1, the size of the second pixel opening POP2, and the size of the third pixel opening POP3. In this case, an edge of the first refractive opening ROP1, an edge of the second refractive opening ROP2, and an edge of the third refractive opening ROP3 may respectively surround an edge of the first pixel opening POP1, an edge of the second pixel opening POP2, and an edge of the third pixel opening POP3. However, the present disclosure is not limited thereto, and in another embodiment, the size of the first refractive opening ROP1, the size of the second refractive opening ROP2, and the size of the third refractive opening ROP3 may be respectively less (e.g., smaller) than the size of the first pixel opening POP1, the size of the second pixel opening POP2, and the size of the third pixel opening POP3. In this case, the edge of the first pixel opening POP1, the edge of the second pixel opening POP2, and the edge of the third pixel opening POP3 may be respectively surround the edge of the first refractive opening ROP1, the edge of the second refractive opening ROP2, and the edge of the third refractive opening ROP3.

In an embodiment, the first refractive layer 510 may include a photoresist. The first refractive layer 510 including the first, second, and third refractive openings ROP1, ROP2, and ROP3 may be formed by coating the photoresist on the thin film encapsulation layer 300 on which the input sensing layer 400 is formed, patterning the photoresist by exposing and developing, and then light-curing the photoresist. By the light-curing, a chemical resistance of the first refractive layer 510 may increase, and the amount of outgas generated from the first refractive layer 510 may decrease.

The second refractive layer 520 may be disposed on the first refractive layer 510. The second refractive layer 520 may be formed on the thin film encapsulation layer 300, and may cover the first refractive layer 510. The second refractive layer 520 may have a second refractive index that is a relatively high refractive index.

The second refractive layer 520 may fill the first, second, and third refractive openings ROP1, ROP2, and ROP3 of the first refractive layer 510. In this case, the second refractive layer 520 may overlap the first, second, and third light emitting elements EE1, EE2, and EE3 and the pixel defining layer 190. An upper surface of the second refractive layer 520 may be substantially planarized (e.g., substantially planar). Accordingly, the second refractive layer 520 may provide a planarized surface to the polarizing layer 600 disposed on the second refractive layer 520.

The second refractive index of the second refractive layer 520 may be greater than the first refractive index of the first refractive layer 510. Accordingly, light may be refracted at an interface between the first refractive layer 510 and the second refractive layer 520. Because the second refractive index is greater than the first refractive index, light incident onto the second refractive index 520 and traveling in a side direction of the display device (e.g., along the plane of the display device, such as a direction parallel to the plane of the substrate 100) may be refracted or reflected at an interface between the first refractive layer 510 and the second refractive layer 520, and may be emitted in a front direction of the display device (e.g., in a direction substantially perpendicular to the plane of the display device, such as a direction perpendicular to the plane of the substrate 100). Accordingly, a front light efficiency of the display device may increase.

In an embodiment, the first refractive layer 510 may include a material having a relatively low refractive index, for example, acrylic resin. Further, the second refractive layer 520 may include, for example, siloxane and at least one of zirconium oxide ($ZrO_x$), aluminum oxide ($AlO_x$) and titanium oxide ($TiO_x$), such that the second refractive layer 520 has a relatively high refractive index.

The polarizing layer 600 may be disposed on the second refractive layer 520. The polarizing layer 600 may reduce reflection of external light of the display device. For example, when the external light having passed through the polarizing layer 600 (in a direction into the display panel) is reflected by layers below the polarizing layer 600 (e.g., the first, second, and, third opposite electrodes 211, 212, and 213) and then passes through the polarizing layer 600 again (in a direction out of the display panel), a phase of the reflected external light may be changed as the incoming external light passes through the polarizing layer 600 twice. As a result, a phase of reflected external light may be different from the phase of the incoming external light entering the polarizing layer 600 so that destructive interference occurs. Accordingly, the reflection of external light may be reduced, thereby increasing visibility of images displayed by the display device (e.g., by reducing reflections and glare due to external light).

The window 700 may be disposed on the polarizing layer 600. The window 700 may protect the components or elements of the display device from external impact, and may provide a display surface of the display device. In an embodiment, the window 700 may include glass, polymer resin such as polycarbonate (PC), polymethyl methacrylate (PMMA), polyarylate (PAR), polyethersulfone (PES), polyethylene terephthalate (PET), polyethylene naphthalate (PEN), etc., or the like.

Hereinafter, an inclination angle of a sidewall of the first refractive layer 510 according to an embodiment will be described with reference to FIGS. 5, 6,7, and 8.

Figure 5:
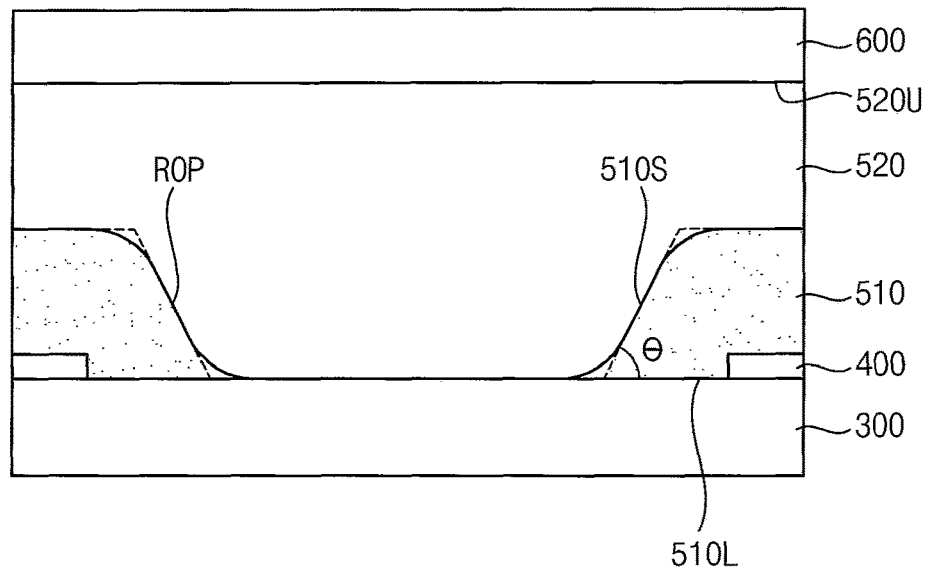
FIG. 5 is a cross-sectional view illustrating a first refractive layer and a second refractive layer according to an embodiment.

FIG. 5 is a cross-sectional view illustrating the first refractive layer 510 and the second refractive layer 520 according to an embodiment. A refractive opening ROP illustrated in FIG. 5 may be any one of the first refractive opening ROP1, the second refractive opening ROP2, and the third refractive opening ROP3 in FIG. 4.

Referring to FIGS. 4 and 5, the first refractive layer 510 may have a lower surface 510L contacting an upper surface of the thin film encapsulation layer 300 and a sidewall 510S exposed by the refractive opening ROP. The sidewall 510S of the first refractive layer 510 may form an angle (e.g., a predetermined angle) with the lower surface 510L of the first refractive layer 510. An inclination angle of the sidewall 510S of the first refractive layer 510 with respect to the lower surface 510L of the first refractive layer 510 may vary from a lower portion of the sidewall 510S toward an upper portion of the sidewall 510S. The first refractive layer 510 may be reflowed in the process of forming the first refractive layer 510 including a photoresist, therefore, the lower portion and the upper portion of the sidewall 510S of the first refractive layer 510 may have a curved shape in a cross-sectional view. Accordingly, the inclination angle of the sidewall 510S of the first refractive layer 510 with respect to the lower surface 510L of the first refractive layer 510 may gradually increase from the lower portion to a point (e.g., a predetermined point) between the lower portion and the upper portion, and then gradually decrease from the point (e.g., the predetermined point) to the upper portion. In this case, the sidewall 510S of the first refractive layer 510 may have a maximum inclination angle θ with respect to the lower surface 510L of the first refractive layer 510 at the point (e.g., the predetermined point) between the lower portion and the upper portion.

The maximum inclination angle θ of the sidewall 510S of the first refractive layer 510 with respect to the lower surface 510L of the first refractive layer 510 may be about 65 degrees or more and about 90 degrees or less (e.g., in the range between about 65 degrees and about 90 degrees or between 65 degrees and 90 degrees). Accordingly, light emitted from the emission layer 201, 202, and 203 of the light emitting element EE1, EE2, and EE3 may be totally reflected by the sidewall 510S of the first refractive layer 510.

Figure 6:
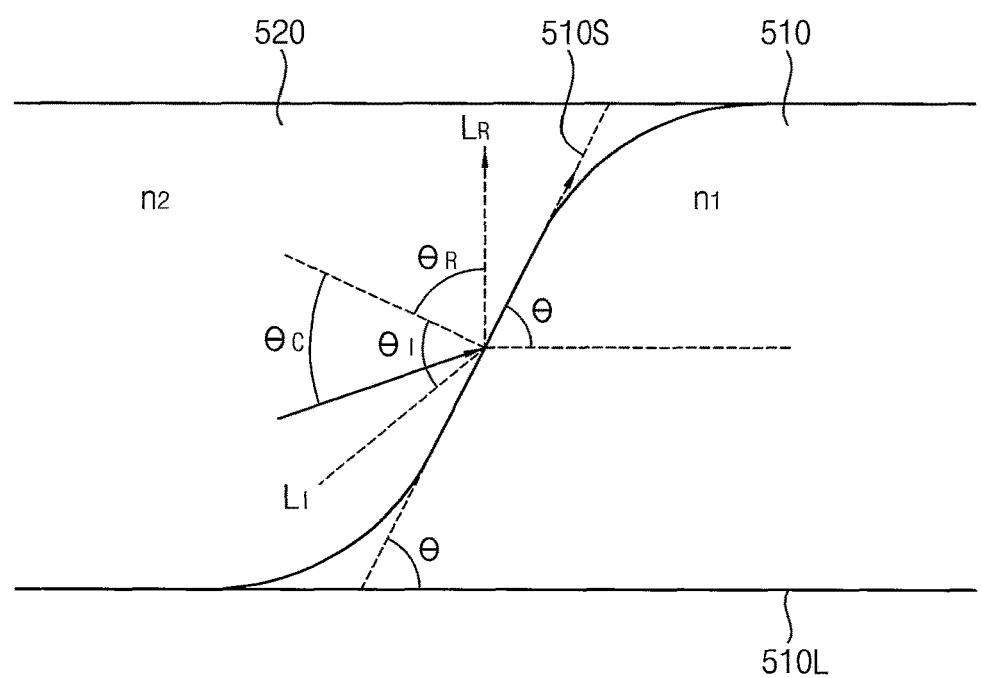
FIG. 6 is an enlarged cross-sectional view of a portion of the first refractive layer and the second refractive layer shown in FIG. 5.

FIG. 6 is an enlarged cross-sectional view of a portion of the first refractive layer 510 and the second refractive layer 520 in FIG. 5.

Referring to FIG. 6, light incident onto the second refractive layer 520 and totally reflected by the sidewall 510S of the first refractive layer 510 may have an incidence angle $\theta_I$ and a reflection angle $\theta_R$. In this case, the reflection angle $\theta_R$ of a reflected light $L_R$ may be substantially equal to the incidence angle $\theta_I$ of an incident light $L_I$ according to the law of reflection.

When the reflected light $L_R$ is emitted in (e.g., toward) the front direction of the display device, because the reflected light $L_R$ is perpendicular to the lower surface 510L of the first refractive layer 510 and a line normal to the sidewall 510S of the first refractive layer 510 is perpendicular to the sidewall 510S of the first refractive layer 510, the reflection angle $\theta_R$ of the reflected light $L_R$ may be equal to the maximum inclination angle θ of the sidewall 510S of the first refractive layer 510 with respect to the lower surface 510L of the first refractive layer 510.

The sidewall 510S of the first refractive layer 510 is an interface between the first refractive layer 510 and the second refractive layer 520, and not all light incident onto the second refractive layer 520 is totally reflected by the sidewall 510S of the first refractive layer 510. As such, when a light is refracted from a medium having a relatively high refractive index to a medium having a relatively low refractive index, as an incidence angle increases, a refraction angle increases. In this case, an incidence angle when the refraction angle is about 90 degrees is called a critical angle $\theta_C$. In other words, only a light having an angle of about the critical angle $\theta_C$ or more among the light incident onto the second refractive layer 520 may be totally reflected by the sidewall 510S of the first refractive layer 510.

For example, when the first refractive index $N_1$ of the first refractive layer 510 is about 1.5 and the second refractive index $N_2$ of the second refractive layer 520 is about 1.65, the critical angle $\theta_C$ may be calculated based on the following Mathematical Equation.

$$\theta_C = \arcsin\frac{N_1}{N_2} \qquad \text{Mathematical Equation}$$

The critical angle $\theta_C$ calculated by the Mathematical Equation is about 65.38 degrees. Accordingly, when the first refractive index $N_1$ of the first refractive layer 510 is about 1.5, the second refractive index $N_2$ of the second refractive layer 520 is about 1.65, and the maximum inclination angle θ of the sidewall 510S of the first refractive layer 510 with respect to the lower surface 510L of the first refractive layer 510 is about 65 degrees or more, light incident onto the second refractive layer 520 may be totally reflected by the sidewall 510S of the first refractive layer 510, and may be emitted in the front direction of the display device. When a maximum inclination angle of the sidewall 510S of the first refractive layer 510 with respect to the lower surface 510L of the first refractive layer 510 is less than about 65 degrees, light incident onto the second refractive layer 520 may not be totally reflected by the sidewall 510S of the first refractive layer 510, and thus, may not be emitted in the front direction of the display device. However, in the present embodiment, because the maximum inclination angle θ of the sidewall 510S of the first refractive layer 510 with respect to the lower surface 510L of the first refractive layer 510 is about 65 degrees or more, light incident onto the second refractive layer 520 (e.g., all light emitted from the emission layer 201, 202, and 203 of the light emitting element EE1, EE2, and EE3 toward the sidewall 510S) may be totally reflected by the sidewall 510S of the first refractive layer 510 and emitted in the front direction of the display device, and the front light efficiency of the display device may increase.

The maximum inclination angle θ of the sidewall 510S of the first refractive layer 510 with respect to the lower surface 510L of the first refractive layer 510 may be about 90 degrees or less, so that an undercut may not be formed at the sidewall 510S of the first refractive layer 510. In other words, the maximum inclination angle θ of the sidewall 510S of the first refractive layer 510 with respect to the lower surface 510L of the first refractive layer 510 may not be an obtuse angle.

Figure 7:
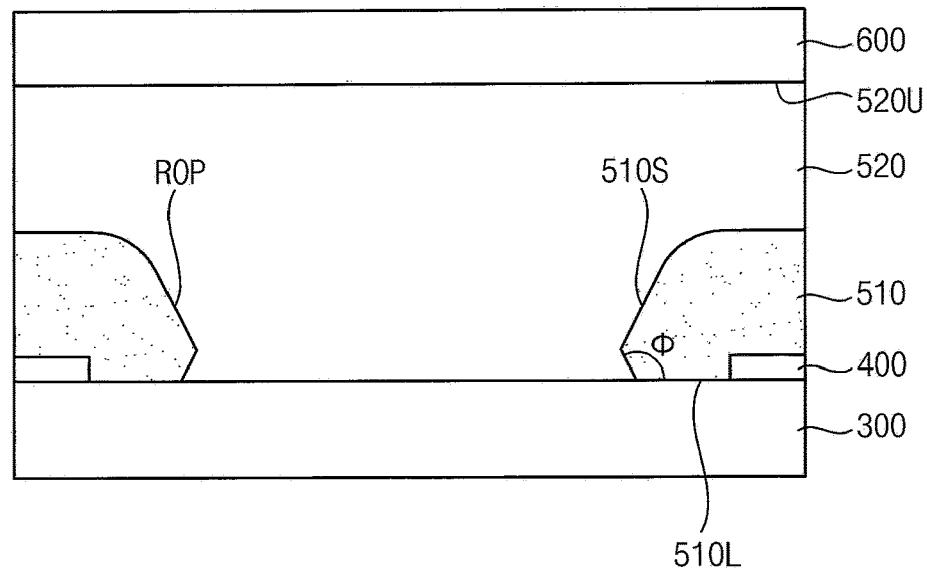
FIG. 7 is a cross-sectional view illustrating a first refractive layer and a second refractive layer according to a comparative example.

FIG. 7 is a cross-sectional view illustrating a first refractive layer and a second refractive layer according to a comparative example.

Referring to FIG. 7, an undercut may be formed at a sidewall 510S of a first refractive layer 510 according to a comparative example. The undercut may be formed while etching material that is used to pattern the first refractive layer 510 penetrates between the thin film encapsulation layer 300 and the first refractive layer 510 during the process of forming the first refractive layer 510. Therefore, in the comparative example, a maximum inclination angle φ of the sidewall 510S of the first refractive layer 510 with respect to the lower surface 510L of the first refractive layer 510 may be greater than about 90 degrees. In other words, the maximum inclination angle φ of the sidewall 510S of the first refractive layer 510 with respect to the lower surface 510L of the first refractive layer 510 may be an obtuse angle. In this case, light incident onto the second refractive layer 520 may be refracted or reflected by the sidewall 510S of the first refractive layer 510 and emitted in a side direction of the display device. Accordingly, the front light efficiency of the display device of this comparative example may decrease.

Figure 8:
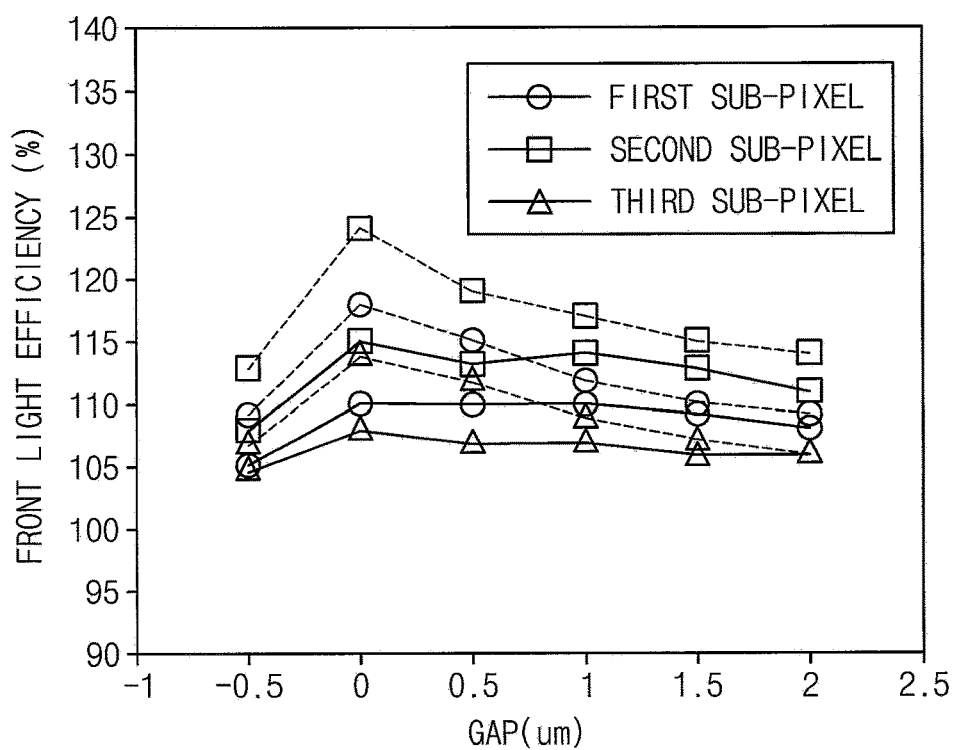
FIG. 8 is a graph illustrating a front light efficiency according to a width of a gap between a pixel opening of a pixel defining layer and a refractive opening of a first refractive layer in a plan view in sub-pixels.

FIG. 8 is a graph illustrating a front light efficiency according to a width of a gap between the pixel opening POP1, POP2, and POP3 of the pixel defining layer 190 and the refractive opening ROP1, ROP2, and ROP3 of the first refractive layer 510 in a plan view in the sub-pixels SPX1, SPX2, and SPX3. In FIG. 8, a horizontal axis of the graph illustrates a planar gap D1, D2, and D3 between the pixel opening POP1, POP2, and POP3 and the refractive opening ROP1, ROP2, and ROP3 illustrated in FIG. 2, and a vertical axis of the graph illustrates a front light efficiency when the first refractive layer 510 is present versus a front light efficiency when the first refractive layer 510 is not present (e.g., at a baseline efficiency of 100%). Here, a negative gap means that the size of the refractive opening ROP1, ROP2, and ROP3 is less (e.g., smaller) than the size of the pixel opening POP1, POP2, and POP3, and a positive gap means that the size of the refractive opening ROP1, ROP2, and ROP3 is greater (e.g., larger) than the size of the pixel opening POP1, POP2, and POP3. In FIG. 8, dotted lines illustrate a front light efficiency when the maximum inclination angle θ of the sidewall 510S of the first refractive layer 510 with respect to the lower surface 510L of the first refractive layer 510 is about 85 degrees according to the present embodiment, and solid lines illustrate a front light efficiency when an undercut is formed at the sidewall 510S of the first refractive layer 510, e.g., the maximum inclination angle φ is greater than about 90 degrees, according to the comparative example.

Referring to FIG. 8, the front light efficiency in the sub-pixels SPX1, SPX2, and SPX3 may decrease when the undercut is formed at the sidewall 510S of the first refractive layer 510 (e.g., in accordance with the comparative example). Specifically, the front light efficiency in the first sub-pixel SPX1 when the undercut is formed is lower than the front light efficiency in the first sub-pixel SPX1 when the undercut is not formed, the front light efficiency in the second sub-pixel SPX2 when the undercut is formed is lower than the front light efficiency in the second sub-pixel SPX2 when the undercut is not formed, and the front light efficiency in the third sub-pixel SPX3 when the undercut is formed is lower than the front light efficiency in the third sub-pixel SPX3 when the undercut is not formed. Compared to the case where the undercut is not formed at the sidewall 510S of the first refractive layer 510 (e.g., in accordance with embodiments of the present invention), the front light efficiency may decrease by about 4% on average when the undercut is formed at the sidewall 510S of the first refractive layer 510. Accordingly, when the maximum inclination angle θ of the sidewall 510S of the first refractive layer 510 with respect to the lower surface 510L of the first refractive layer 510 is about 65 degrees or more and about 90 degrees or less, light emitted from the emission layer 201, 202, and 203 of the light emitting element EE1, EE2, and EE3 may be totally reflected by the sidewall 510S of the first refractive layer 510 and emitted in the front direction of the display device, and the front light efficiency of the display device may increase. Accordingly, according to some embodiments of the present disclosure, an undercut is not formed at the sidewall of the first refractive layer 510.

Hereinafter, a difference between the second refractive index of the second refractive layer 520 and the first refractive index of the first refractive layer 510 according to an embodiment will be described with reference to FIGS. 9, 10, and 11.

A difference between the second refractive index of the second refractive layer 520 and the first refractive index of the first refractive layer 510 may be about 0.15 or more (e.g., greater than or equal to 0.15). In other words, a value obtained by subtracting the first refractive index from the second refractive index may be about 0.15 or more (e.g., greater than or equal to 0.15). In an embodiment, the first refractive index may be about 1.5, and the second refractive index may be about 1.65 or more.

Figure 9:
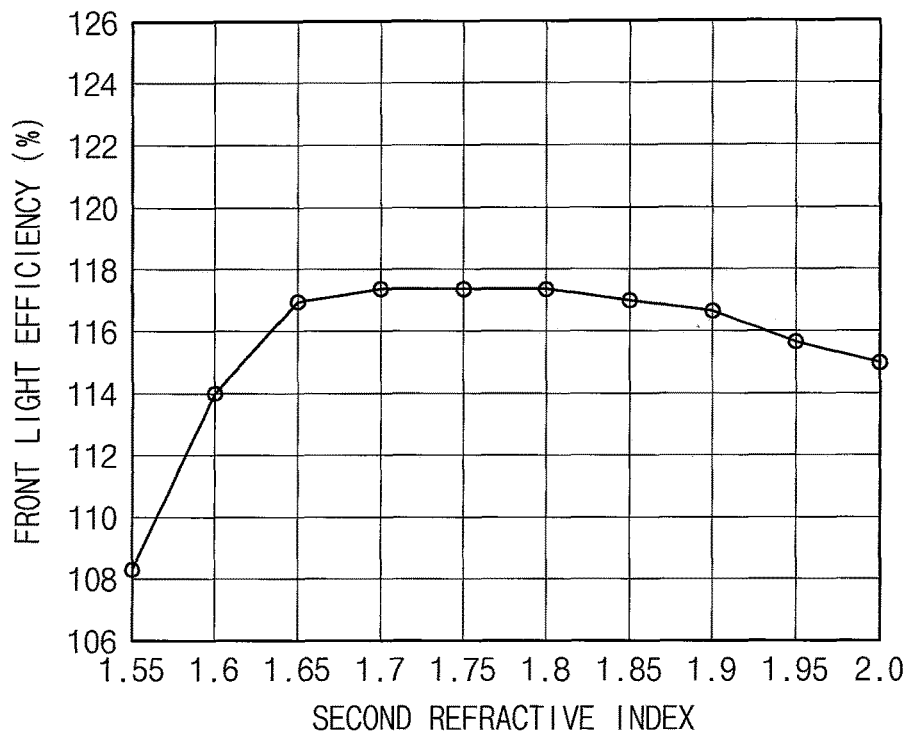
FIG. 9 is a graph illustrating a front light efficiency according to a second refractive index of a second refractive layer in a first sub-pixel.

FIG. 9 is a graph illustrating a front light efficiency according to the second refractive index of the second refractive layer 520 in the first sub-pixel SPX1. FIG. 10 is a graph illustrating a front light efficiency according to the second refractive index of the second refractive layer 520 in the second sub-pixel SPX2. FIG. 11 is a graph illustrating a front light efficiency according to the second refractive index of the second refractive layer 520 in the third sub-pixel SPX3. Here, the first refractive index of the first refractive layer 510 is about 1.5, and the maximum inclination angle θ of the sidewall 510S of the first refractive layer 510 with respect to the lower surface 510L of the first refractive layer 510 is about 85 degrees.

Referring to FIG. 9, as the second refractive index increases, the front light efficiency in the first sub-pixel SPX1 may change. In other words, as a difference between the second refractive index and the first refractive index increases, the front light efficiency in the first sub-pixel SPX1 may change. The graph may have a significant change in slope when the second refractive index is about 1.65, and the front light efficiency may have a maximum value when the second refractive index is about 1.7. In other words, the graph may be drastically bent (e.g., have a significant change in slope) when the difference between the second refractive index and the first refractive index is about 0.15. Therefore, according to some embodiments, an optimal range of values for the second refractive index is about 1.65 or more. In other words, in some embodiments, an optimal difference between the second refractive index and the first refractive index is about 0.15 or more (e.g., greater than or equal to 0.15). When the second refractive index is less than about 1.65, the front light efficiency in the first sub-pixel SPX1 drastically deteriorates (e.g., is significantly less efficient than when the second refractive index is greater than or equal to about 1.65).

Figure 10:
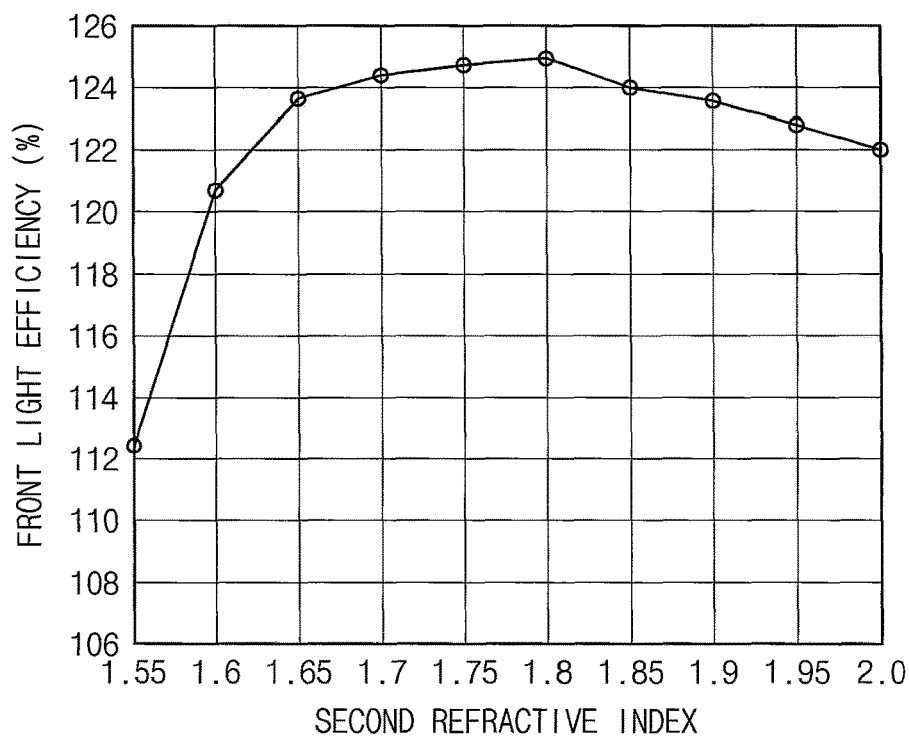
FIG. 10 is a graph illustrating a front light efficiency according to a second refractive index of a second refractive layer in a second sub-pixel.

Referring to FIG. 10, as the second refractive index increases, the front light efficiency in the second sub-pixel SPX2 may change. The graph may be drastically bent (e.g., have a significant change in slope) when the second refractive index is about 1.65, and the front light efficiency may have a maximum value when the second refractive index is about 1.8. Therefore, according to some embodiments, an optimal range of values for the second refractive index is about 1.65 or more. When the second refractive index is less than about 1.65, the front light efficiency in the second sub-pixel SPX2 drastically deteriorates (e.g., is significantly less efficient than when the second refractive index is greater than or equal to about 1.65).

Figure 11:
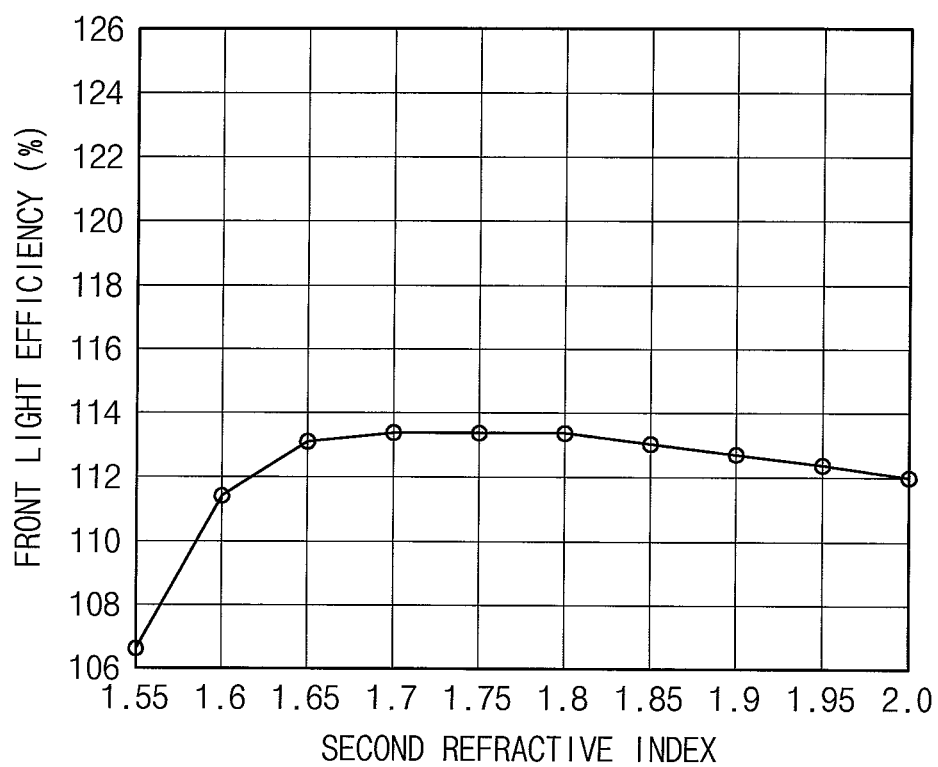
FIG. 11 is a graph illustrating a front light efficiency according to a second refractive index of a second refractive layer in a third sub-pixel.

Referring to FIG. 11, as the second refractive index increases, the front light efficiency in the third sub-pixel SPX3 may change. The graph may be drastically bent (e.g., have a significant change in slope) when the second refractive index is about 1.65, and the front light efficiency may have a maximum value when the second refractive index is about 1.7. Therefore, an optimal second refractive index is about 1.65 or more. When the second refractive index is less than about 1.65, the front light efficiency in the third sub-pixel SPX3 drastically deteriorates (e.g., is significantly less efficient than when the second refractive index is greater than or equal to about 1.65).

As illustrated in FIGS. 9, 10, and 11, when the difference between the second refractive index and the first refractive index in the first, second, and third sub-pixels SPX1, SPX2, and SPX3 is about 0.15, e.g., when the first refractive index and the second refractive index are about 1.5 and about 1.65, respectively, the front light efficiency may drastically or significantly change. Therefore, compared to the case where the difference between the second refractive index and the first refractive index is less than about 0.15, e.g., the first refractive index and the second refractive index are about 1.5 and less than about 1.65, respectively, the front light efficiency of the display device may drastically (e.g., significantly) increase when the difference between the second refractive index and the first refractive index is about 0.15 or more, e.g., the first refractive index and the second refractive index are about 1.5 and about 1.65 or more, respectively.

The display device according to the embodiments may be applied to a display device included in a computer, a notebook, a mobile phone, a smartphone, a smart pad, a PMP, a PDA, an MP3 player, or the like.

Although the display device according to the embodiments have been described with reference to the drawings, the illustrated embodiments are examples, and may be modified and changed by a person having ordinary knowledge in the relevant technical field without departing from the technical spirit described in the following claims and equivalents thereof.

What is claimed is:

1. A display device, comprising:
a pixel electrode;
a pixel defining layer on the pixel electrode and having a pixel opening that exposes at least a portion of the pixel electrode;
an emission layer on the pixel electrode in the pixel opening;
an opposite electrode on the emission layer;
a first refractive layer on the opposite electrode and having a refractive opening, the first refractive layer having a first refractive index; and
a second refractive layer on the first refractive layer, the second refractive layer having a second refractive index greater than the first refractive index, wherein an upper surface of the second refractive layer is planarized opposite the refractive opening in a region of the second refractive layer overlapping a central portion of the pixel electrode,
wherein a maximum inclination angle of a sidewall of the first refractive layer exposed by the refractive opening with respect to a lower surface of the first refractive layer is between 65 degrees and 90 degrees.

2. The display device of claim 1, wherein an undercut is not formed at the sidewall of the first refractive layer.

3. The display device of claim 1, wherein the refractive opening overlaps the pixel opening.

4. The display device of claim 1, wherein a light emitted from the emission layer is totally reflected by the sidewall of the first refractive layer.

5. The display device of claim 1, wherein a difference between the second refractive index and the first refractive index is greater than or equal to 0.15.

6. The display device of claim 5, wherein the first refractive index is 1.5 and the second refractive index is 1.65.

7. The display device of claim 1, wherein the refractive opening has a same shape as a shape of the pixel opening.

8. The display device of claim 1, further comprising:
a thin film encapsulation layer between the opposite electrode and the first refractive layer and having a planarized upper surface.

9. The display device of claim 8, further comprising:
an input sensing layer between the thin film encapsulation layer and the first refractive layer,
wherein the first refractive layer covers the input sensing layer.

10. The display device of claim 1, further comprising:
a polarizing layer on the second refractive layer.

11. A display device, comprising:
a pixel electrode;
a pixel defining layer on the pixel electrode and having a pixel opening that exposes at least a portion of the pixel electrode;
an emission layer on the pixel electrode in the pixel opening;
an opposite electrode on the emission layer;
a first refractive layer on the opposite electrode and having a refractive opening, the first refractive layer having a first refractive index; and
a second refractive layer on the first refractive layer and having a second refractive index greater than the first refractive index, the second refractive layer having a planarized surface opposite the refractive opening in a region of the second refractive layer overlapping a central portion of the pixel electrode,
wherein a difference between the second refractive index and the first refractive index is greater than or equal to 0.15.

12. The display device of claim 11, wherein the first refractive index is 1.5 and the second refractive index is 1.65.

13. The display device of claim 11, wherein the refractive opening overlaps the pixel opening.

14. The display device of claim 11, wherein a light emitted from the emission layer is totally reflected by a sidewall of the first refractive layer exposed by the refractive opening.

15. The display device of claim 11, wherein the first refractive layer includes a photoresist.

16. The display device of claim 11, wherein the first refractive layer includes acrylic resin.

17. The display device of claim 11, wherein the second refractive layer includes siloxane and at least one of zirconium oxide, aluminum oxide, and titanium oxide.

18. A display device, comprising:
a light emitting element;
a pixel defining layer surrounding the light emitting element;
a first refractive layer on the light emitting element and the pixel defining layer, the first refractive layer overlapping the pixel defining layer and having a first refractive index; and
a second refractive layer on the first refractive layer, the second refractive layer overlapping the light emitting element and the pixel defining layer, and having a second refractive index greater than the first refractive index, wherein an upper surface of the second refractive layer overlapping the light emitting element is planarized in a region of the second refractive layer overlapping a central portion of the light emitting element,
wherein a maximum inclination angle of a sidewall of the first refractive layer with respect to a lower surface of the first refractive layer is between 65 degrees and 90 degrees.

19. The display device of claim 18, wherein a light emitted from the light emitting element is totally reflected by the sidewall of the first refractive layer.

20. The display device of claim 18, wherein a difference between the second refractive index and the first refractive index is greater than or equal to 0.15.

* * * * *